United States Patent

[11] 3,594,899

[72] Inventors John William Archibald Hunt
Northfield;
Michael Searle, Sutton Coldfield, both of, England

[21] Appl. No. 722,976
[22] Filed Apr. 22, 1968
[45] Patented July 27, 1971
[73] Assignee Joseph Lucas (Industries) Limited
Birmingham, England
[32] Priority May 15, 1967
[33] Great Britain
[31] 22400/67

[54] INTERCONNECTING ELECTRICAL COMPONENTS
1 Claim, 3 Drawing Figs.

[52] U.S. Cl. .......... 29/626,
29/203, 29/472.3, 29/493, 29/573, 174/68.5, 228/6, 269/9, 269/7, 317/101, 339/17
[51] Int. Cl. .......... H05k 3/00
[50] Field of Search .......... 29/624, 203
J, 573, 626, 628, 630 G; 174/68.5; 317/101; 339/17; 228/6; 269/9, 37

[56] References Cited

UNITED STATES PATENTS

| | | | |
|---|---|---|---|
| 2,981,868 | 4/1961 | Severson | 317/101 CP |
| 3,107,319 | 10/1963 | Vizzier, Sr. | 317/101 CC |
| 3,137,534 | 6/1964 | Schafer et al. | 317/101 C X |
| 3,295,189 | 1/1967 | Hammell | 29/624 |
| 3,326,726 | 6/1967 | Bassett et al. | 29/573 X |
| 3,355,078 | 11/1967 | Smith | 174/68.5 X |
| 3,356,786 | 12/1967 | Helms | 174/68.5 |
| 3,392,256 | 7/1968 | Bradham | 29/203 X |
| 3,323,023 | 3/1967 | Walker | 29/628 |
| 3,365,536 | 1/1968 | Martin | 29/628 X |
| 3,465,435 | 9/1969 | Steranko | 29/628 |

FOREIGN PATENTS

| | | | |
|---|---|---|---|
| 1,072,283 | 12/1959 | Germany | 29/630G |

*Primary Examiner*—John F. Campbell
*Assistant Examiner*—Robert W. Church
*Attorney*—Holman and Stern

ABSTRACT: In the manufacture of a voltage regulator, or in the interconnection of components on a printed circuit generally, a masking device is used on the printed circuit having slits therein. Conductors are engaged within the slits so as to extend between and contact the components to be interconnected, and the whole assembly is then heated, solder being provided to make the required connections.

INVENTOR
J. W. A. Hunt
M. Searle
BY Glascock, Downing & Seebold
ATTORNEYS

INVENTOR
BY I. W. A. Hunt
M. Searle
ATTORNEY

INVENTOR
J. W. A. Hunt
BY M. Searle.

ATTORNEY

INTERCONNECTING ELECTRICAL COMPONENTS

This invention relates to the interconnection of electrical components printed, deposited or positioned on a substrate. The invention is particularly useful in connection with thick film circuits, but can be used in thin film circuits and conventional printed circuits formed by etching or similar techniques, all of which are collectively referred to for convenience as printed circuits. Thus, the invention can be used to form a connection between part of a component positioned on a printed circuit and a component of the printed circuit, or between two parts of components positioned on the printed circuit, or if desired, between two components of the printed circuit, although in the latter case the two parts would normally be interconnected by part of the printed circuit itself.

In one aspect, the invention resides in a method of interconnecting two electrical components on a printed circuit, comprising placing a conductor in a slit formed within a masking device so that the conductor extends between and contacts the components, solder being provided between the conductor and components at the points of contact thereof, and then heating the assembly to melt the solder and form the required connection.

The masking device can be in more than one part, as will become apparent from the specific example.

The invention further resides in apparatus for performing at least part of the method, and in the product of the method.

Figure 2:
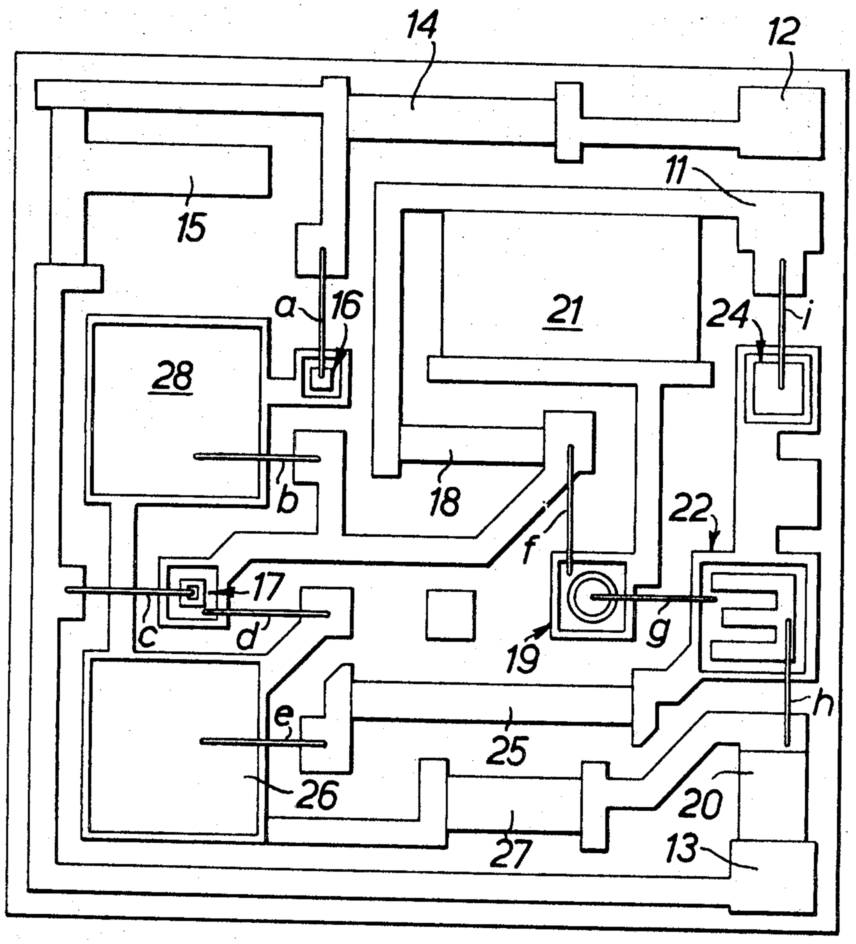
Figure 3:
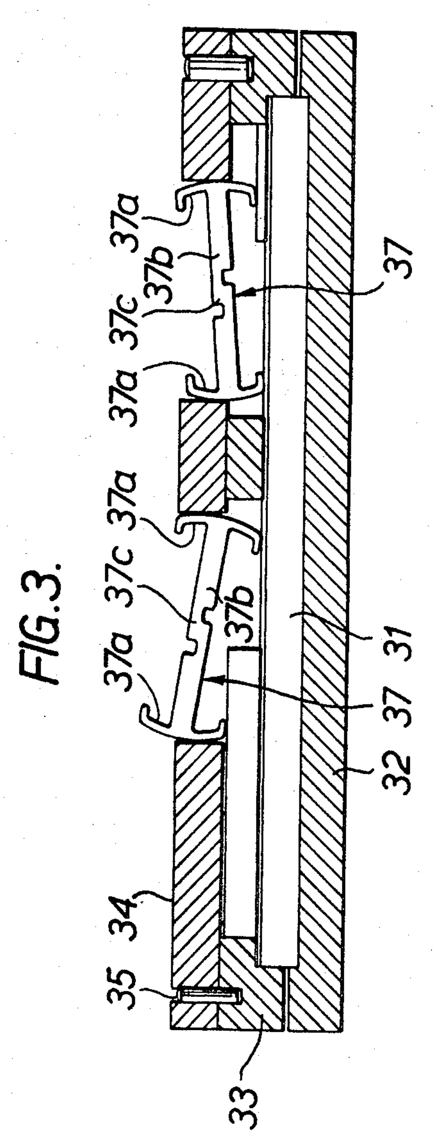

An example of the invention will now be described as applied to the manufacture of a voltage regulator. In the accompanying drawings, FIG. 1 illustrates the voltage regulator which can be manufactured in accordance with the invention, FIG. 2 illustrates a thick film printed circuit and its corresponding active components, the circuit corresponding to FIG. 1, and FIG. 3 is a sectional view through a masking device illustrating the interconnection of components.

Figure 1:
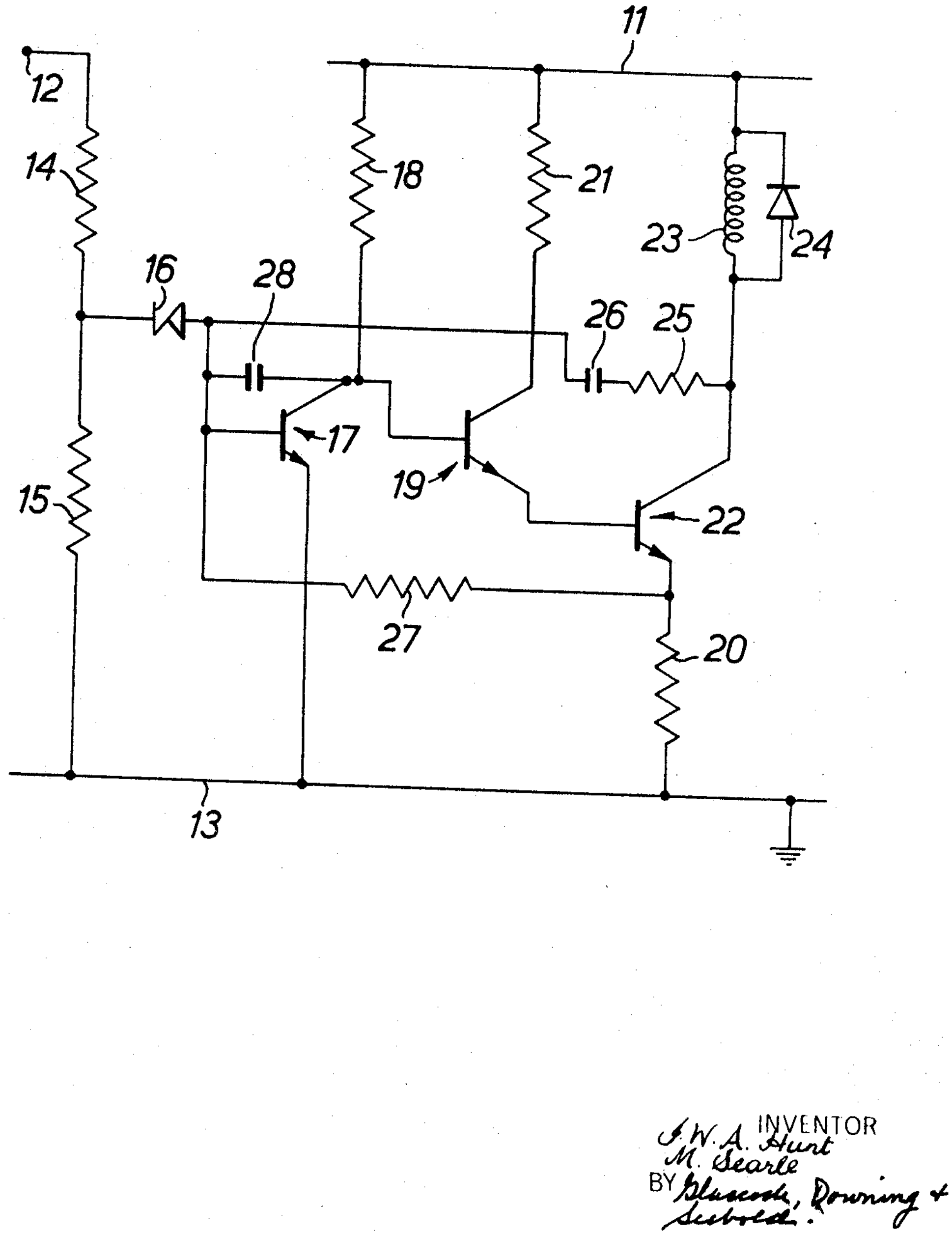

Referring first to FIG. 1, the regulator shown is designed for use with an alternator on a road vehicle, the alternator serving through a full wave rectifier to provide power to a battery having a positive terminal 12 and a negative terminal connected to an earthed supply line 13. The alternator also supplies power by way of one or more auxiliary diodes to a positive supply line 11.

Connected between the terminal 12 and the line 13 are a pair of resistors 14, 15 the junction of which is connected to the cathode of a Zener diode 16 having its anode connected to the base of an NPN transistor 17. The transistor 17 has its emitter connected to the line 13 and its collector connected to the line 11 through a resistor 18, the collector being further connected to the base of an NPN transistor 19. The transistor 19 has its collector connected through a resistor 21 to the line 11, and its emitter connected to the base of an NPN transistor 22, the emitter of which is connected to the line 13 through a resistor 20, and the collector of which is connected to the line 11 through the field winding 23 of the alternator, the winding 23 being bridged by a diode 24. The collector of the transistor 22 is further connected to the base of the transistor 17 through a resistor 25 and a capacitor 26 in series, whilst the emitter of the transistor 22 is connected to the base of the transistor 17 through a resistor 27. The capacitor 28 is connected between the base and collector of the transistor 17.

In operation, when the battery voltage is below a predetermined value, the Zener diode 16 is nonconductive, and so no base current flows through the transistor 17. Current flowing through the resistor 18 turns the transistor 19 on, and the consequential flow of current through the resistor 21 and the transistor 19 turns the transistor 22 on, so that current flows in the field winding 23. When the predetermined voltage is reached, the Zener diode 16 conducts to provide base current to the transistor 17, which removes the base current from the transistor 19, and consequently removes the base current from the transistor 22. By virtue of the feedback connection through the resistor 25 and capacitor 26, the circuit oscillates between one state with the transistor 17 fully conductive and the transistors 19, 22 off, and a second state with the transistor 17 off and the transistors 19, 22 off, and a second state with the transistor 17 off and the transistors 19, 22 fully conductive, the mark-space ratio being determined by the current flowing through the Zener diode 16, which in turn is determined by the battery voltage. The arrangement is such that the mean current flow in the winding 23 maintains the battery voltage substantially constant. The capacitor 28 is provided to minimize radio interference, and the feedback connection through the resistor 27 in conjunction with the resistor 20 ensures that overall gain of the system is substantially constant, and does not vary with the characteristics of the transistors 17, 19. Moreover, the circuit values are chosen to provide temperature compensation.

FIG. 2 illustrates a thick film printed circuit corresponding to the circuit diagram shown in FIG. 1. The various components in FIG. 1 have been indicated by the same reference numerals in FIG. 2.

The thick film circuit is printed with conductive areas which receive one plate of the capacitor 28, one plate of the capacitor 26, the collectors of the transistors 17, 19, 22 the anode of the diode 24 and the anode of the Zener diode 16. The winding 23 is not, of course, secured to the thick film circuit, but external terminals are provided for connection to the winding 23.

In assembling the regulator, the thick film substrate 31 (FIG. 3), is placed on a holder 32, and a mask 33 is then located on the holder covering the substrate 31, but leaving windows adapted to receive the components listed above. Solder is either printed on the thick film, or preformed solder parts are placed in the windows. The components are placed in the windows in contact with the solder. The following connections require to be made:

a. The cathode of the Zener diode 16 to the junction of resistors 14, 15.
b. One plate of capacitor 28 to the collector of transistor 17.
c. The emitter of transistor 17 to the line 13.
d. The base of transistor 17 to the resistor 27.
e. One plate of capacitor 26 to the resistor 25.
f. The collector of the transistor 17 to the base of the transistor 19.
g. The emitter of the transistor 19 to the base of the transistor 22.
h. The emitter of the transistor 22 to the line 13.
i. The cathode of the diode 24 to the line 11.

In order to make these connections, a second mask 34 is located relative to the mask 33 by pins 35. The mask 34 is formed with slits for receiving conductors in the form of laminae 37 which as shown in the drawing are shaped somewhat like a dumbbell with a pair of similar end portions 37*a* joined by an integral intermediate portion 37*b* having intermediate its ends a neck portion37*c*. Corresponding slits are formed in the mask 33, so that each lamina can extend between one of the components positioned in the mask 33 and a conductive area on the thick film circuit. One of the laminae 37 is provided for each of the missing connections (a) to (i) referred to above, and the design of the thick film printed circuit is such that all the laminae used can have the same length. The laminae used to make the required connections (a) to (i) are shown in FIG. 2 and marked with the appropriate reference letters (a) to (i).

The ends of the laminae 37 which engage the ends of the slits in the mask 34 are formed as arcs of a circle so that similar laminae can be used for the various connections even though, as shown in FIG. 3, the laminae do not all extend at the same angle to the substrate. At positions where the laminae contact the printed circuit, solder can be printed on the circuit, but at positions where the laminae contact a component, solder, either in the form of cream or an insert, is used between the laminae and the component. The entire assembly is then heated to melt the solder and form the connections between the laminae and the components, and between the components and the printed circuit, simultaneously.

After the connections have been made, the mask can be removed and used again. Conveniently, the masks are cleaned to remove any flux therefrom by a known form of ultrasonic cleaning apparatus.

In use, opposite ends of a lamina 37 may be at different temperatures, and the purpose of the neck portions 37*a* is to take up any differential expansion of the laminae.

Having thus described out invention what we claim as new and desire to secure by Letters Patent is:

1. A method of manufacturing an electrical device having a printed circuit and a number of components thereon, comprising a. locating on the printed circuit a first mask having therein windows adapted to receive components to be secured to the printed circuit, b. placing the components within said windows, solder being provided between the components and the printed circuit, c. locating a second mask relative to the first mask, the second mask having therein slits extending between the various parts of the printed circuit and components which require to be interconnected, d. placing within said slits conductors which extend between said parts, solder being provided between said parts and said conductors, and said conductors being in the form of laminae and all having the same length, the ends of the laminae which contact the ends of the slits being formed as arcs of a common circle, e. soldering the parts to the respective conductors by heating the assembly to solder melting temperature whereby the solder wets the joints and upon cooling and solder solidification the connections are completed.